US008431923B2

(12) United States Patent
Goswami (10) Patent No.: US 8,431,923 B2
(45) Date of Patent: Apr. 30, 2013

(54) SEMICONDUCTOR STRUCTURE AND SEMICONDUCTOR DEVICE INCLUDING A DIODE STRUCTURE AND METHODS OF FORMING SAME

(75) Inventor: Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 13/022,233

(22) Filed: Feb. 7, 2011

(65) Prior Publication Data

US 2012/0199807 A1   Aug. 9, 2012

(51) Int. Cl.
 *H01L 29/06* (2006.01)
 *H01L 21/02* (2006.01)

(52) U.S. Cl.
 USPC ............................................................ 257/9

(58) Field of Classification Search . 257/E27.016–E27.035, E27.037–E27.038, 257/E27.047–E27.048, E27.071, E27.09, 257/E27.092–E27.093, E27.095, E27.114–E27.116, 257/E21.008–E21.021, E21.364, E29.17, 257/E21.645–E21.694, 225–234, 390, E21.076, 257/E21.662, 9, 314–326, E29.005, E21.004, 257/68–71, 905–908, E27.078, E29.3–E29.309, 257/E21.179–E21.182, E21.209–E21.21, 257/E21.422, E21.423, E27.076, E27.098–E27.101, 257/E27.077, 296–313, 533, 595–602, 923–924, 257/E27.016–E27.017, E27.019–E27.021, 257/E27.023–E27.025, E27.03–E27.035, 257/E27.037–E27.038, E27.041–E27.045, 257/E27.047–E27.048, E27.092–E27.093; 438/171, 257–278, 190, 210, 902, 238–253, 438/329, 379, 387, 444, 901, 95
See application file for complete search history.

(56) References Cited

U.S. PATENT DOCUMENTS

| 7,576,384 | B2 * | 8/2009 | Gidon ............................ 257/316 |
| 2008/0093595 | A1 | 4/2008 | Song et al. |
| 2009/0095985 | A1 | 4/2009 | Lee et al. |
| 2009/0184305 | A1 | 7/2009 | Lee et al. |

(Continued)

OTHER PUBLICATIONS

International Search Report and Written Opinion for International Application No. PCT/US2012/023266, mailed Sep. 20, 2012.
Giovannetti et al., Doping Graphene with Metal Contacts, The America Physical Society, Physical Review Letters, vol. 101 (2008) pp. 026803-1-026803-4.
Nandamuri et al., Chemical Vapor Deposition of Graphene Films, Nanotechnology, vol. 21 (2010) 4 pages.

*Primary Examiner* — Dao H Nguyen
*Assistant Examiner* — Tram H Nguyen
(74) *Attorney, Agent, or Firm* — TraskBritt (57) ABSTRACT

Methods of forming diode structures for use in memory cells and memory arrays, such as resistive random access memory (RRAM). The methods include forming a first electrode by chemisorbing a graphite material (e.g., graphene) on a conductive material. A low-k dielectric material may be formed over surfaces of the first electrode exposed through an opening in a dielectric material overlying the first electrode, followed by formation of a high-k dielectric material over the low-k dielectric material. A remaining portion of the opening may be filled with another conductive material to form a second electrode. The first and second electrodes of the resulting diode structure have different work functions and, thus, provide a low thermal budget, a low contact resistance, a high forward-bias current and a low reverse-bias current. A memory cell and a memory array including such a diode structure are also disclosed.

32 Claims, 6 Drawing Sheets

U.S. PATENT DOCUMENTS

| | | |
|---|---|---|
| 2009/0257270 A1 | 10/2009 | Schricker et al. |
| 2010/0006811 A1 | 1/2010 | Xu et al. |
| 2010/0008124 A1 | 1/2010 | Scheuerlein et al. |
| 2010/0102291 A1 | 4/2010 | Xu |
| 2011/0114918 A1* | 5/2011 | Lin et al. ................. 257/24 |
| 2012/0056161 A1* | 3/2012 | Avouris et al. ........... 257/24 |
| 2012/0085991 A1* | 4/2012 | Cohen et al. ............. 257/28 |
| 2012/0211723 A1* | 8/2012 | Dimitrakopoulos et al. ..... 257/9 |

* cited by examiner

SEMICONDUCTOR STRUCTURE AND SEMICONDUCTOR DEVICE INCLUDING A DIODE STRUCTURE AND METHODS OF FORMING SAME

TECHNICAL FIELD

Embodiments of the present disclosure relate to methods of forming diode structures for use in semiconductor memory and, in addition, to semiconductor structures and devices that include such diode structures.

BACKGROUND

Resistive random access memories (RRAMs) are non-volatile memory devices that utilize a change in resistance characteristics of so-called "variable resistance materials" to store data. Such variable resistance materials (e.g., transition metal oxides or phase change materials) have a resistance that changes relatively significantly at a particular voltage. When a particular voltage is applied to the variable resistance material, the resistance of the variable resistance material decreases, which is referred to as a so-called "on" state. When a reset voltage is applied to the variable resistance material, the resistance of the variable resistance material increases, which is referred to as a so-called "off" state. Among conventional RRAMs, a cross-point RRAM has a relatively simple cell structure and relatively high density.

A conventional cross-point RRAM includes a plurality of substantially parallel word lines and a plurality of substantially parallel bit lines, the bit lines arranged substantially perpendicular to the word lines. A so-called "cross-point" is formed at the intersection of the word lines and bit lines. A memory resistor is disposed between the word lines and bit lines at each cross-point. The memory resistor may have a multi-layered structure including, for example, a layer including a memory element and at least one layer including a non-ohmic device (e.g., a metal-insulator-metal (MIM) device).

Cross-point memory architecture provides high device density, yet it suffers from substantial leakage current, which may result in increased power dissipation and a reduced sensing margin. Parasitic resistance associated with conductive lines (i.e., word lines and bit lines) may result in degradation of output signal and restrictions on array size.

DETAILED DESCRIPTION

Methods of forming diode structures are disclosed, as are memory cells and memory arrays that include such diode structures. The diode structures may be formed having at least one electrode that includes a graphite material. The graphite material, such as graphene, may be used in combination with a conductive material to form a material having a substantially reduced work function compared to the work function of the conductive material alone. As used herein, the term "graphene" means and includes a monolayer film of carbon atoms arranged in a two-dimensional hexagonal lattice. The graphite material may form an interface between a low-k dielectric material and the conductive material of the at least one electrode. Since the material formed from the graphite material and the conductive material has a low work function in comparison to conventional electrode materials (i.e., metals), the diode structure may have a substantially increased forward-bias current and a substantially reduced reverse-bias current in comparison to conventional diode structures including metal electrodes. In addition, the material formed from the graphite material and the conductive material may provide the diode structure with substantially reduced contact resistance. The diode structures may be used, for example, as switching elements in high-density memory devices, such as, cross-point resistive random access memory (RRAM) devices and cross-point phase change random access memory (PCRAM). As used herein, the term "cross-point" means and includes a position at which a first conductive line and a second conductive line cross each other. When referring to memory arrays, the term "cross-point," means and includes a memory array that includes sets of generally perpendicular conductive lines with memory cells at the intersections between the sets of the conductive lines.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor structures described below do not form a complete semiconductor device. Only those process acts and structures necessary to understand the embodiments of the present disclosure are described in detail below. Additional acts to form a complete semiconductor device from the semiconductor structures may be performed by conventional fabrication techniques.

Figure 1:
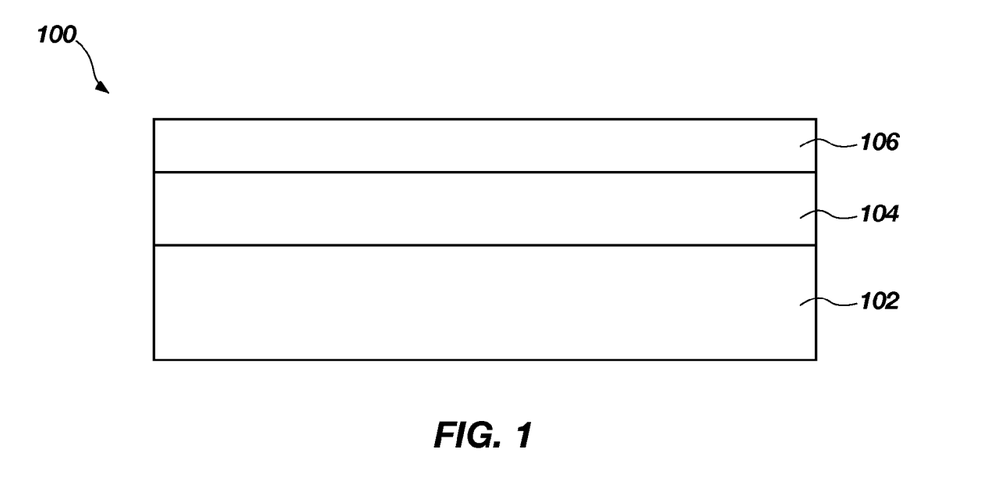
FIGS. 1 through 7 are partial cross-sectional views of a semiconductor structure and illustrate a method of forming a diode structure in accordance with embodiments of the present disclosure.

FIGS. 1 through 8 are simplified partial cross-sectional views of a semiconductor structure 100 illustrating embodiments of a method of forming a diode structure. Referring to FIG. 1, the semiconductor structure 100 may include a graphite material 106 overlying a conductive material (e.g., a conductive line, such as word line 104), overlying a substrate 102. As used herein, the term "substrate" means and includes a base material or construction upon which additional materials are fowled. The substrate may be a semiconductor substrate, a base semiconductor material on a supporting structure, a metal electrode or a semiconductor substrate having one or more materials, structures or regions formed thereon. The substrate 102 may be a conventional silicon substrate or other bulk substrate including a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, or indium phosphide. The substrate 102 may be doped or undoped.

The word line 104 may be formed, for example, by forming the conductive material in a trench in the substrate 102 and removing portions of the conductive material overlying the substrate 102 using a conventional abrasive planarization process, such as a chemical-mechanical polishing (CMP) process. The conductive material used to form the word line 104 may be formed over the substrate 102 using a conventional deposition process, such as a chemical vapor deposition (CVD) process, an atomic layer deposition (ALD) process or a physical vapor deposition (PVD) process. By way of example and not limitation, the word line 104 may be formed from a metal, such as, nickel (Ni), cobalt (Co), palladium (Pd), tungsten (W), or platinum (Pt), or a metal-containing material, such as, titanium nitride (TiN).

The graphite material 106 may be formed over the word line 104 using a conventional process, such as, a CVD process or mechanical exfoliation of highly oriented pyrolytic graphite (HOPG). For example, catalytic growth of the graphite material 106 on the word line 104 may be performed using a CVD process that employs a carbon-containing precursor and a metal word line 104 as a catalyst. Such a CVD process may be performed at relatively low temperatures (i.e., temperatures of less than about 1000° C.). In embodiments in which the word line 104 is formed from nickel and the graphite material 106 is formed from graphene, the chemical deposition process used to form the graphene over the metal may include exposing the nickel to a carbon-containing precursor at a temperature of between about 600° C. and about 700° C. and, more particularly, about 650° C. The carbon-containing precursor may be, for example, acetylene ($C_2H_2$), ethylene ($C_2H_4$), or methane ($CH_4$). An exposure time of the carbon-containing precursor to the word line 104 may be varied to control a thickness of the graphite material 106 on the word line 104. In embodiments in which the word line 104 is formed from nickel and the graphite material 106 is formed from graphene, the exposure time may be controlled to form a desired number of monolayers of graphene. For example, the graphite material 106 may include a single monolayer of graphene. The graphite material 106 may have a substantially reduced work function in comparison to the conductive material of the word line 104. By way of non-limiting example, the graphite material 106 may have a work function of less than about 4.6 eV.

Figure 2:
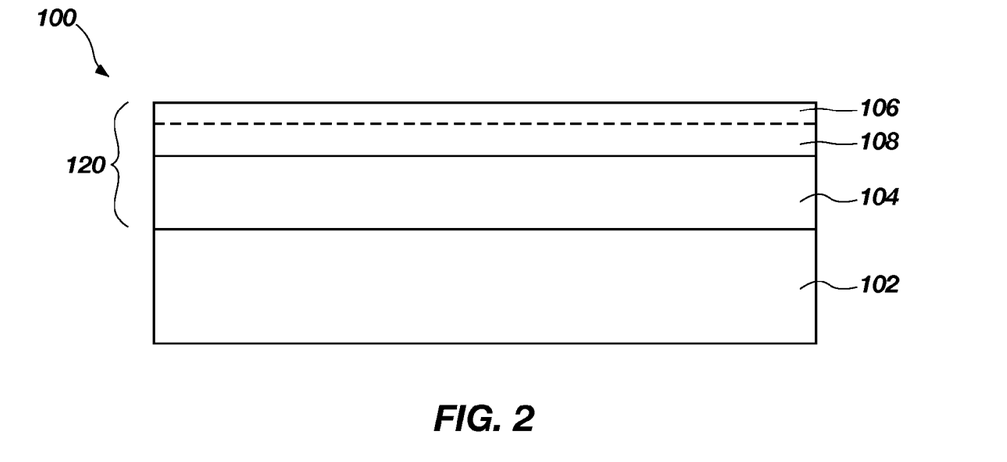

As shown in FIG. 2, a graphite/conductive material 108 that includes a mixture of the graphite material 106 and the conductive material of the word line 104 may be formed during deposition of the graphite material 106 (as described with respect to FIG. 1) and/or by an optional annealing process performed after deposition of the graphite material 106. For example, the annealing process may be performed by exposing the semiconductor structure 100 of FIG. 1 to a temperature of between about 400° C. and about 800° C. and, more particularly, about 600° C. to form the graphite/conductive material 108. During the deposition process and/or the optional annealing process, the graphite/conductive material 108 may be formed by cross-diffusion of the conductive material of the word line 104 and the graphite material 106, or by chemisorbing the graphite material 106 onto the conductive material of the word line 104. As used herein, the terms "chemisorb," "chemisorbed" and "chemisorbing" mean and include chemically binding a material onto a surface of another material. In embodiments in which the graphite material 106 is formed from graphene and the word line 104 is formed from a metal, such as nickel, the graphene may be chemisorbed on the metal resulting in formation of a graphene-metal material as graphite/conductive material 108. Due to interactions between the graphene and the metal, the graphene-metal material may exhibit mixed characteristics or properties of the graphene and the metal. By way of example and not limitation, the graphite/conductive material 108 may include the graphite material 106 doped with the conductive material of the word line 104, or may include a chemical complex of the graphite material 106 and the conductive material of the word line 104. During the deposition process and/or the annealing process, the graphite material 106 may be substantially completely mixed with the conductive material of the word line 104 to form the graphite/conductive material 108, or a portion of the graphite material 106 (shown in broken lines) may remain over the graphite/conductive material 108.

The graphite/conductive material 108 may have a substantially reduced work function in comparison to conventional electrode materials (e.g., nickel, cobalt, palladium, tungsten, platinum, and titanium nitride). For example, the work function of the graphite/conductive material 108 may be less than about 5 eV. By way of example and not limitation, the word line 104 may be formed from nickel and the graphite material 106 may be formed from graphene and the graphite/conductive material 108 formed during the deposition process and/or the annealing process may be a graphene-nickel material. The graphene-nickel material may include a complex of graphene and nickel and may have a work function of about 3.7 eV. The graphite/conductive material 108 (e.g., the graphene-nickel material) may be used to form a first electrode 120 of a diode structure having a substantially reduced work function and resistance in comparison to conventional metal electrode materials, as will be described.

Figure 3:
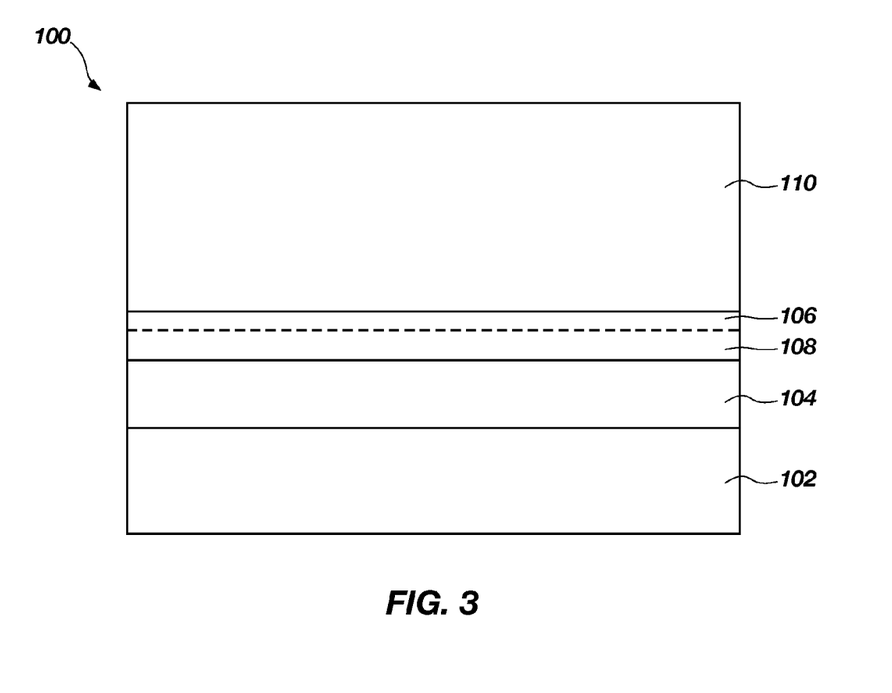

Referring to FIG. 3, a dielectric material 110 may be formed over the graphite/conductive material 108 or, if present, the remaining portion of the graphite material 106. The dielectric material 110 may include a nitride, such as silicon nitride, or an oxide, such as silicon oxide. The dielectric material 110 may be formed over and in contact with exposed surfaces of the graphite/conductive material 108 using a conventional vapor deposition process, such as a physical vapor deposition (PVD) process or a chemical vapor deposition (CVD) process.

Figure 4:
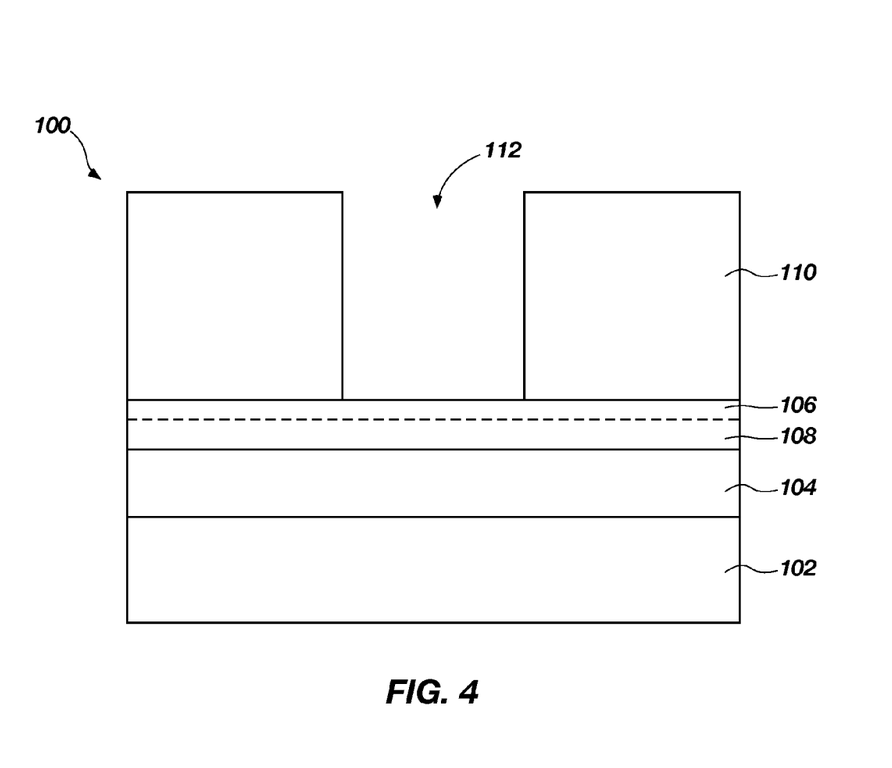

As shown in FIG. 4, at least one opening 112 may be formed through the dielectric material 110 to expose a surface of the graphite/conductive material 108 or, if present, a surface of the remaining portion of the graphite material 106. The opening 112 may be formed by removing a portion of the dielectric material 110 using, for example, conventional photolithography techniques (e.g., masking and etching) known in the art of integrated circuit fabrication. In embodiments, where the dielectric material 110 is formed from a silicon nitride, a silicon dioxide mask (not shown) having an aperture overlying a region of the dielectric material 110, which the opening 112 will be formed, may be formed over the dielectric material 110 and a phosphoric acid ($H_3PO_4$) solution may be introduced to the dielectric material 110 at a temperature of about 180° C. to form the opening 112. By way of example and not limitation, the opening 112 may extend longitudinally into a plane of FIG. 4. The opening 112 may have an aspect ratio of, for example, between about 1:1 and about 20:1 and, more particularly, between about 5:1 and about 10:1.

Figure 5:
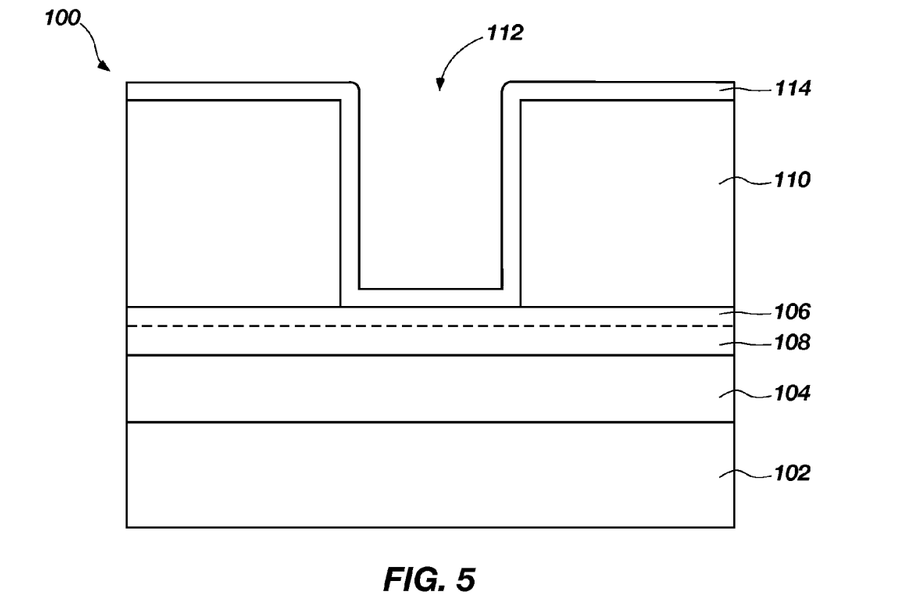

Referring to FIG. 5, a low-k dielectric material 114 may be formed over surfaces of the semiconductor structure 100 (i.e., exposed surfaces of the dielectric material 110, the graphite/conductive material 108 or, if present, the remaining portion of the graphite material 106). For example, the low-k dielectric material 114 may be formed by depositing a dielectric material, such as silicon dioxide (SiO$_2$), over and in contact with the exposed surfaces of the dielectric material 110 and the graphite/conductive material 108 or, if present, the graphite material 106. The low-k dielectric material 114 may be formed using a conventional vapor deposition process, such as a physical vapor deposition (PVD) process or a chemical vapor deposition (CVD) process. By way of example and not limitation, the low-k dielectric material 114 may be formed having a thickness of between about 0.5 nm and about 3 nm and, more particularly, between about 1 nm and about 2 nm. The low-k-dielectric material 114 may be substantially conformally deposited so that surfaces of the dielectric material 110 and the graphite/conductive material 108 or, if present, the graphite material 106, exposed by the opening 112 are lined with the low-k dielectric material 114 leaving a portion of the opening 112 unfilled.

Figure 6:
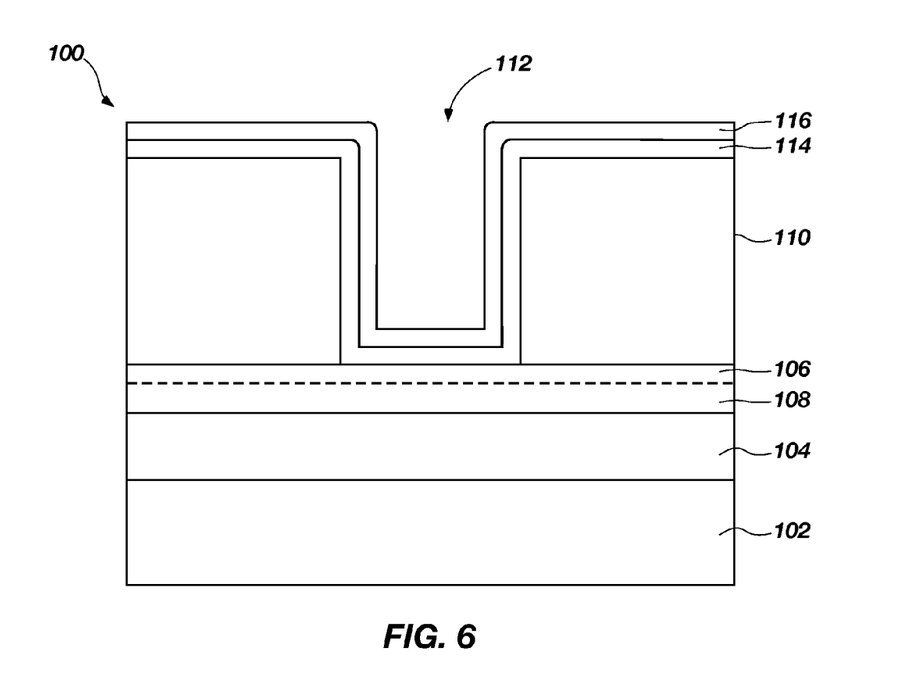

As shown in FIG. 6, a high-k dielectric material 116 may be formed over exposed surfaces of the low-k dielectric material 114. For example, the high-k dielectric material 116 may be formed by depositing a transition metal oxide material, such as, hafnium dioxide (HfO$_2$), titanium oxide (TiO$_2$), zirconium oxide (ZrO$_2$), nickel oxide (e.g., Ni$_2$O$_3$) or zinc oxide (ZnO), over the low-k dielectric material 114. The high-k dielectric material 116 may be formed using a conventional vapor deposition process, such as a physical vapor deposition (PVD) process or a chemical vapor deposition (CVD) process. By way of example and not limitation, the high-k dielectric material 116 may be formed having a thickness of less than about 5 nm and, more particularly, between about 1 nm and about 2 nm. The high-k dielectric material 116 may be substantially conformally deposited over surfaces of the low-k dielectric material 114 so that a portion of the opening 112 remains unfilled.

Figure 7:
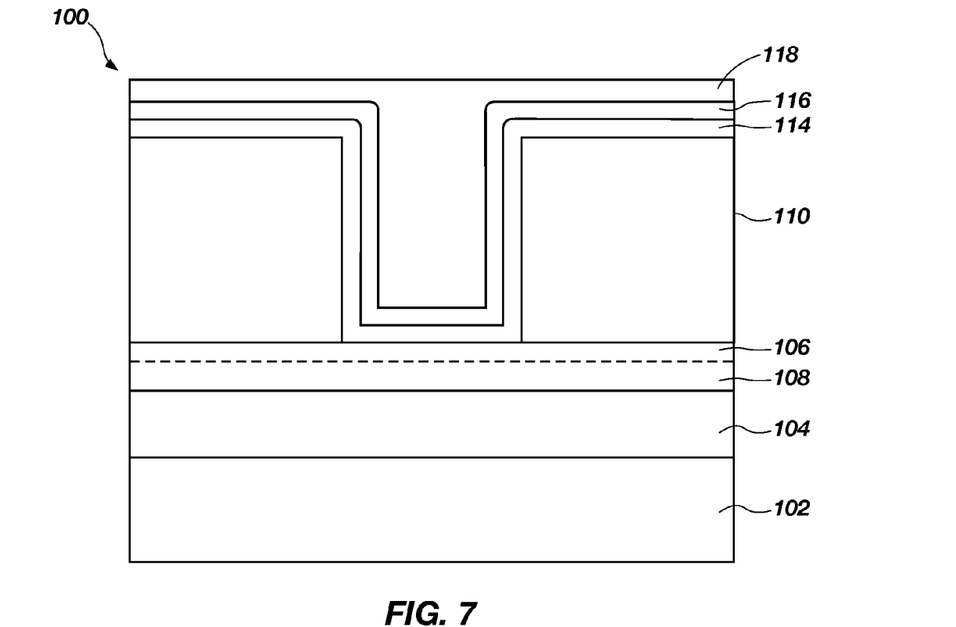

Referring to FIG. 7, a conductive material 118 may be formed over the high-k dielectric material 116. The conductive material 118 may be formed by depositing a metal, such as nickel (Ni), cobalt (Co), palladium (Pd), tungsten (W), platinum (Pt), titanium nitride (TiN) or alloys thereof, in the opening 112. The conductive material 118 may be formed using a conventional deposition process, such as, a chemical vapor deposition process, a physical vapor deposition process or a physical deposition process. The conductive material 118 may have a substantially increased work function in comparison to the graphite/conductive material 108. By way of non-limiting example, the conductive material 118 may be formed having a thickness sufficient to substantially fill the remaining portion (i.e., the unfilled portion) of the opening 112. By way of example and not limitation, the conductive material 118 may be formed having a thickness of between about 1 nm and about 10 nm and, more particularly, about 5 nm.

Figure 8:
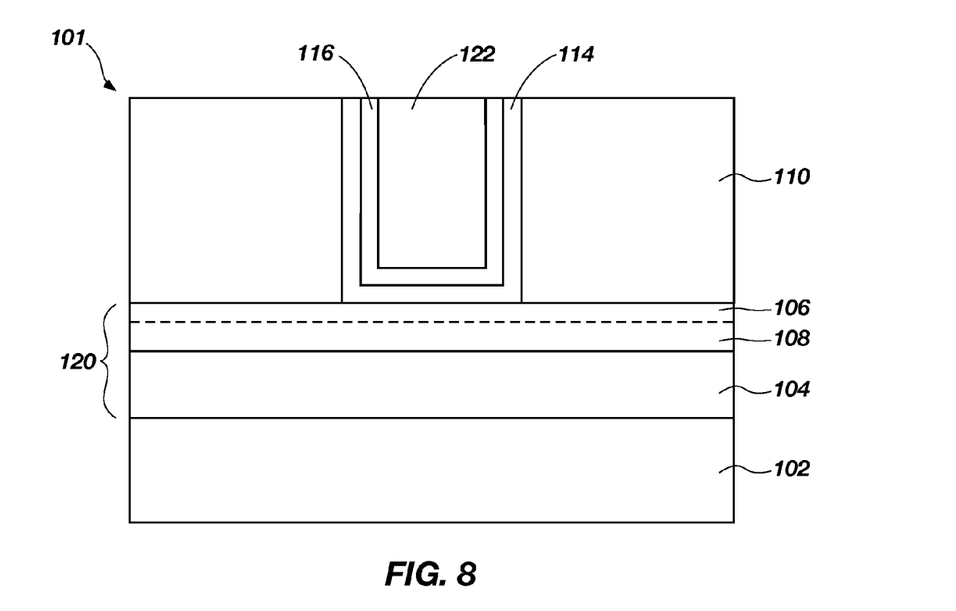
FIG. 8 is a partial cross-sectional view of an embodiment of a diode structure of the present disclosure.

An exposed surface of the semiconductor structure 100 shown in FIG. 7 may be subjected to a material removal process, such as an abrasive planarization process (e.g., a chemical-mechanical polishing (CMP) process or a mechanical polishing process), to remove portions of each of the low-k dielectric material 114, the high-k dielectric material 116 and the conductive material 118 overlying the dielectric material 110 to form diode structure 101 including a second electrode 122, as shown in FIG. 8. The material removal process may be a chemical-mechanical polishing process that is performed using a conventional chemical-mechanical polishing apparatus and a slurry that enables removal of the materials (e.g., the low-k dielectric material 114, the high-k dielectric material 116 and the conductive material 118 shown in FIG. 7) to form the diode structure 101. After removing the portions of each of the low-k dielectric material 114, the high-k dielectric material 116 and the conductive material 118 overlying the dielectric material 110, a surface of the diode structure 101 may be substantially planar.

In the diode structure 101 shown in FIG. 8, the graphite/conductive material 108 may form an interface between the word line 104 and the low-k dielectric material 114. Thus, the diode structure 101 may include the first electrode 120 having a different work function than the second electrode 122. The difference between the work function of the first electrode 120 and the work function of the second electrode 122 may be greater than about 1 eV. The first electrode 120 may include the word line 104, the graphite/conductive material 108 and, if present, the graphite material 106. By way of non-limiting example, the graphite/conductive material 108 of the first electrode 120 may have a substantially reduced work function in comparison to the work function of the second electrode 122. In embodiments in which the graphite/conductive material 108 of the first electrode 120 includes a mixture of graphene and nickel (i.e., the graphene-nickel material) and the second electrode 122 includes nickel, the graphene-nickel material may have a work function of about 3.7 eV and the nickel may have a work function of about 5.01 eV. The presence of the graphite/conductive material 108 provides the first electrode 120 with a substantially reduced work function in comparison to the second electrode 122. Since the work function of the first electrode 120 is substantially less than the work function of the second electrode 122, the diode structure 101 may have a reduced thermal budget and contact resistance, an increased forward-bias current and a reduced reverse-bias current in comparison to conventional diode structures. Conventional diode structures are formed using polysilicon, which requires a high temperature anneal (e.g., exposure to temperatures of about 1000° C.) in order to activate dopants therein. Since polysilicon is not used, the disclosed methods provide a low thermal budget process for forming a diode structure.

Figure 9A:
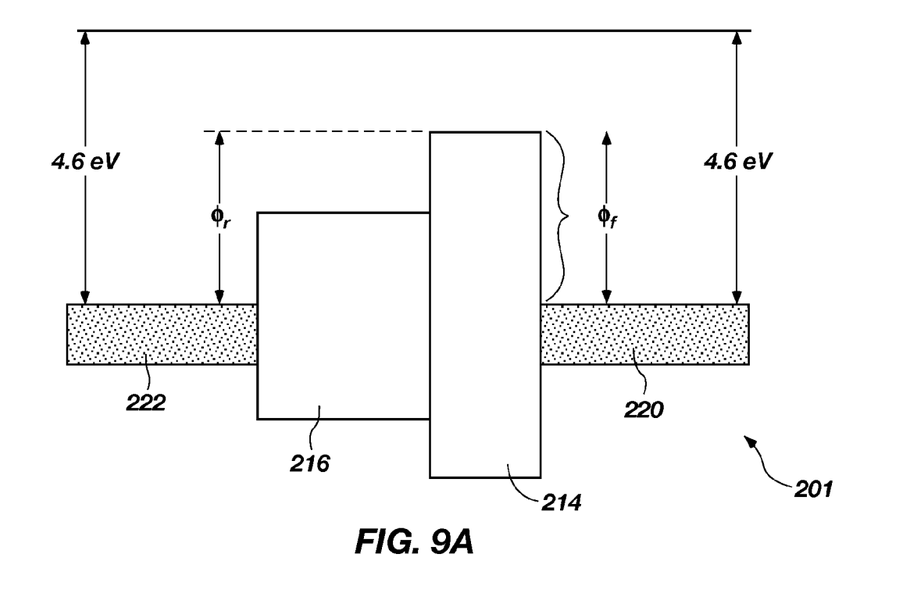
FIGS. 9A and 9B are schematic diagrams of band structures comparing a conventional diode structure (FIG. 9A) with the embodiment of the diode structure of the present disclosure (FIG. 9B) shown in FIG. 8.
Figure 9B:
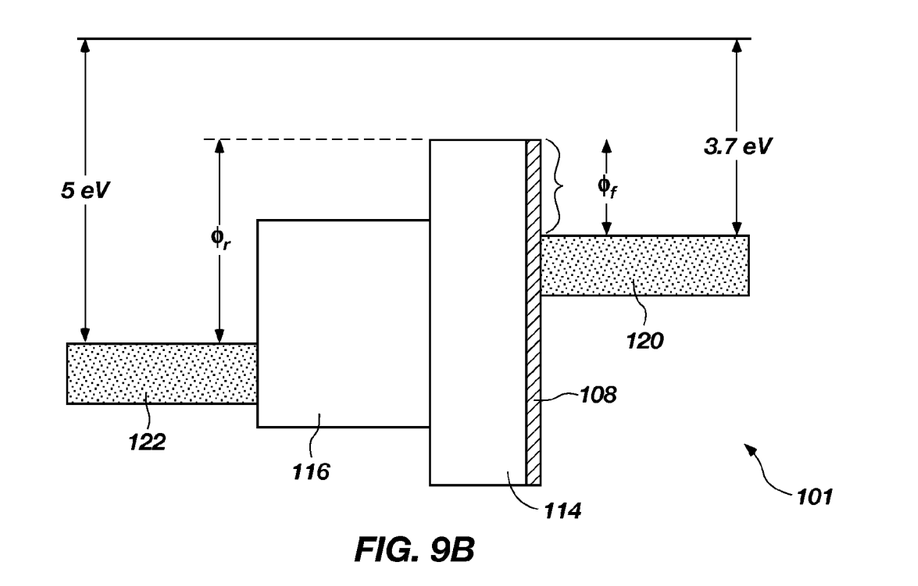

Referring to FIGS. 9A and 9B, respectively, band structures of a conventional diode structure 201 and of an embodiment of the diode structure 101 of the present disclosure are shown. The conventional diode structure 201 shown in FIG. 9A includes titanium nitride electrodes 220, 222 and a low-k dielectric material 214 and a high-k dielectric material 216 disposed between the titanium nitride electrodes 220, 222. As shown in FIG. 9A, a barrier height for a forward biasing scheme ($\Phi_f$) and a barrier height for a reverse biasing scheme ($\Phi_r$) of each of the titanium nitride electrodes 220, 222 of the conventional diode structure 201 is about 4.6 eV. The embodiment of the diode structure 101 of the present disclosure shown in FIG. 9B includes a first electrode 120 including a graphene-nickel material (graphite/conductive material 108) at the interface between the low-k dielectric material 114 and the nickel of the word line 104 (FIG. 8), a nickel second electrode 122 and a high-k dielectric material 116 between the low-k dielectric material 114 and the nickel second electrode 122. As shown in FIG. 9B, the graphene-nickel material (graphite/conductive material 108) has a work function of about 3.7 eV and the nickel second electrode 122 has a work function of about 5 eV. Thus, the diode structure 101 has a substantially reduced forward barrier height in comparison to the conventional diode structure 201 (FIG. 9A). Due to the substantially reduced forward barrier height ($\Phi_f$), the diode structure 101 (FIG. 9B) exhibits a substantially increased forward-bias current in comparison to the conventional diode structure 201 (FIG. 9A). Due to the substantially increased reverse barrier height ($\Phi_r$), the diode structure 101 (FIG. 9B)

also exhibits a substantially reduced reverse-bias current in comparison to the conventional diode structure 201 (FIG. 9A).

Figure 10:
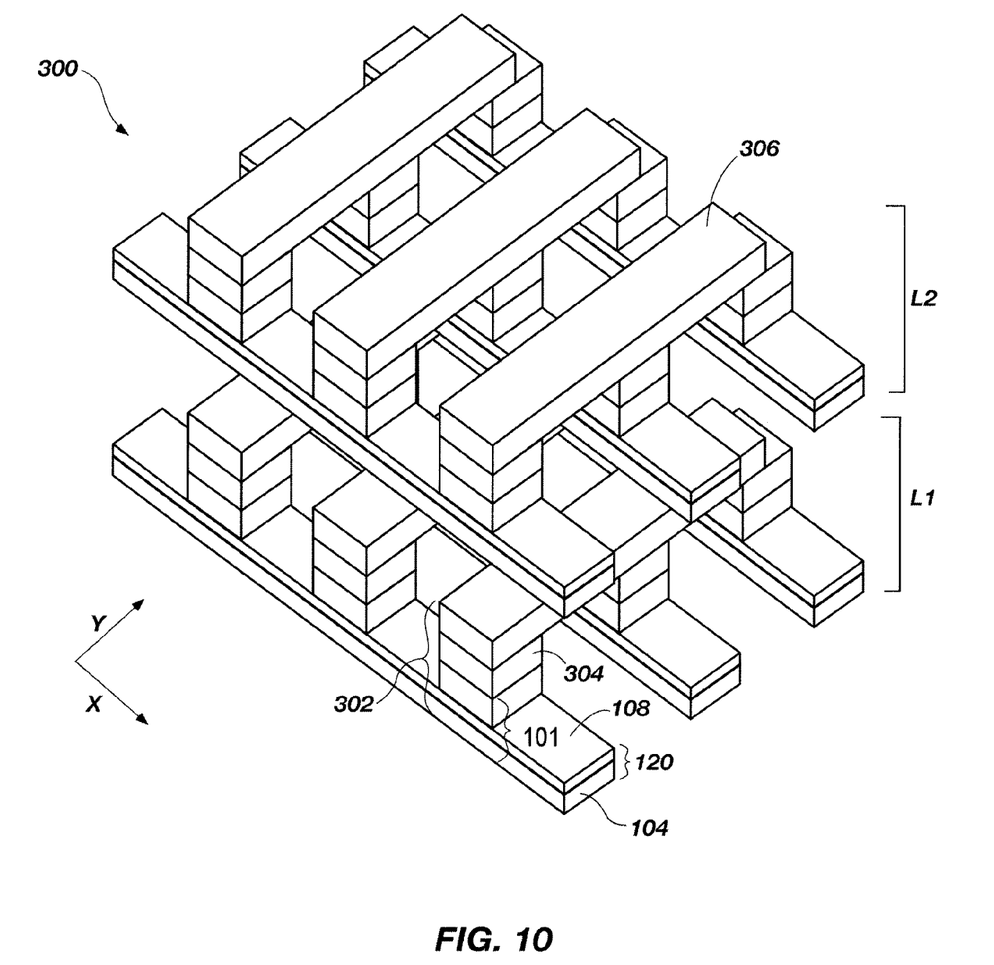
FIG. 10 is a perspective view of an embodiment of a cross-point memory array formed from a plurality of memory cells, each memory cell including the embodiment of the diode structure shown in FIG. 8.

As shown in FIG. 10, a cross-point memory array 300 may be formed that includes a plurality of levels L1, L2 of one-diode-one-resistor (1D-1R) memory cells 302. Each of the memory cells 302 may include a diode structure 101, such as that shown in FIG. 8, in series with a resistor 304. By way of example and not limitation, the memory cells 302 may be arranged in a plurality of rows extending in a first direction X and in a second direction Y. The cross-point memory array 300 shown in FIG. 10 includes three (3) rows in the first direction X and three (3) second direction Y. However, the cross-point memory array 300 may include any number of rows in the first direction X and the second direction Y. Additionally, the rows of memory cells 302 aligned in the first direction X may be substantially perpendicular to the rows of memory cells 302 aligned in the second direction Y.

To form the cross-point memory array 300, a plurality of the diode structures 101 may be formed as previously described with respect to FIGS. 1 through 8. The first electrodes 120 of one or more of the diode structures 101 may be formed on a single word line 104. The resistor 304 may be formed, for example, by depositing at least one resistive material adjacent the second electrode 122 (not shown) of each of the diode structures 101. Conductive lines 306 may be formed over and in contact with one or more of the resistors 304 in a direction substantially perpendicular to the word lines 104. Thus, the memory cells 302 are each disposed between one of the word lines 104 and one of the conductive lines 306, which is disposed substantially perpendicular to the word line 104 to form the cross-point memory array 300. During operation of the cross-point memory array 300, the diode structures 101 may block unwanted leakage-current paths through neighboring memory cells 302. The word line 104 and/or the conductive line 306 may be electrically coupled with a selection transistor (not shown) that enables reading of information from or writing of information to, the memory cells 302. The difference in work function (e.g., greater than about 1 eV) between the first electrode 120 and the second electrode 122 (FIG. 8) of the diode structure 101 provides a substantially increased forward-bias current and a substantially reduced reverse-bias current. In addition, the graphite/conductive material 108 of the first electrode 120 (e.g., the graphene-nickel material) provides improved thermal-stability and substantially reduced contact resistance using operation of the cross-point memory array 300.

CONCLUSION

In one embodiment, the present disclosure includes a method of forming a diode structure. Such a method may include forming a graphite material over a conductive material, combining at least a portion of the graphite material with at least a portion of the conductive material to form a first electrode, forming a dielectric material over the first electrode, removing a portion of the dielectric material to form an opening exposing a surface of the first electrode, forming a low-k dielectric material over surfaces of the opening, forming a high-k dielectric material over the low-k dielectric material and filling a remaining portion of the opening with another conductive material to form a second electrode.

In a further embodiment, the present disclosure includes a method of forming a semiconductor device. Such a method may include forming a plurality of diode structures, forming a plurality of resistors and forming at least one conductive line over the plurality of resistors. The plurality of diode structures may be formed by chemisorbing at least a portion of a graphite material to a conductive material to form at least one first electrode, forming a dielectric material over the at least one first electrode, forming a low-k dielectric material in a plurality of openings in the dielectric material overlying the at least one first electrode, forming a high-k dielectric material in the plurality of openings and forming another conductive material in the plurality of openings to form a plurality of second electrodes. Each resistor may be formed adjacent one of the plurality of second electrodes.

In yet another embodiment, the present disclosure includes a semiconductor structure. The semiconductor structure may include a first electrode comprising a graphite material chemisorbed on a conductive material, a low-k dielectric material overlying the first electrode and a high-k dielectric material disposed between the low-k dielectric and a second electrode.

In yet another embodiment, the present disclosure includes a semiconductor device. The semiconductor device includes a plurality of memory cells disposed between a plurality of first conductive lines and second conductive lines, each of the memory cells of the plurality include a resistor disposed adjacent a diode structure. The diode structure includes a first electrode including a conductive material and a graphite material, a low-k dielectric material and a high-k dielectric material overlying the first electrode and a second electrode overlying the high-k dielectric material. The graphite material is located at an interface between the conductive material and the low-k dielectric material.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a diode structure, comprising:
   chemisorbing at least a portion of a graphite material onto a conductive material to form a first electrode;
   forming a dielectric material over the first electrode;
   removing a portion of the dielectric material to form an opening exposing a surface of the first electrode;
   forming a low-k dielectric material over surfaces of the opening;
   forming a high-k dielectric material over the low-k dielectric material; and
   filling a remaining portion of the opening with another conductive material to form a second electrode.

2. The method of claim 1, wherein chemisorbing at least a portion of a graphite material onto a conductive material comprises chemisorbing graphene onto the conductive material.

3. The method of claim 1, wherein chemisorbing at least a portion of a graphite material onto a conductive material comprises chemisorbing the at least a portion of the graphite material onto at least one of nickel, cobalt, palladium, tungsten, platinum, and titanium nitride.

4. The method of claim 1, wherein chemisorbing at least a portion of a graphite material onto a conductive material comprises forming the at least a portion of the graphite material over the conductive material while simultaneously combining the at least a portion of the graphite material with at least a portion of the conductive material.

5. The method of claim 1, wherein chemisorbing at least a portion of a graphite material onto a conductive material comprises exposing the conductive material to a carbon-containing precursor at a temperature of between about 600° C. and about 650° C.

6. The method of claim 1, wherein chemisorbing at least a portion of a graphite material onto a conductive material comprises exposing the at least a portion of the graphite material and at least a portion of the conductive material to a temperature of between about 600° C. and about 700° C.

7. The method of claim 1, wherein removing a portion of the dielectric material to form an opening exposing a surface of the first electrode comprises removing a portion of the dielectric material to form an opening exposing a surface of a material comprising graphene and nickel.

8. The method of claim 1, wherein removing a portion of the dielectric material to form an opening exposing a surface of the first electrode comprises removing a portion of the dielectric material to form an opening exposing a surface of the at least a portion of the graphite material overlying a material comprising the at least a portion of the graphite material and the conductive material.

9. The method of claim 2, wherein chemisorbing graphene onto the conductive material comprises chemisorbing the graphene onto nickel.

10. The method of claim 2, wherein chemisorbing graphene onto the conductive material comprises exposing the conductive material to a carbon-containing precursor at a temperature of less than about 700° C.

11. The method of claim 1, wherein forming a low-k dielectric material over surfaces of the opening comprises forming silicon dioxide over the dielectric material and the first electrode.

12. The method of claim 1, wherein forming a high-k dielectric material over the low-k dielectric material comprises forming hafnium dioxide over the low-k dielectric material.

13. The method of claim 1, further comprising removing portions of the low-k dielectric material, the high-k dielectric material and the another conductive material overlying the dielectric material to form the second electrode.

14. A method of forming a semiconductor device, comprising:
    forming a plurality of diode structures, comprising:
        chemisorbing at least a portion of a graphite material to a conductive material to form at least one first electrode;
        forming a dielectric material over the at least one first electrode;
        forming a low-k dielectric material in a plurality of openings in the dielectric material overlying the at least one first electrode;
        forming a high-k dielectric material in the plurality of openings; and
        forming another conductive material in the plurality of openings to form a plurality of second electrodes;
    forming a plurality of resistors, each resistor adjacent one of the plurality of second electrodes; and
    forming at least one conductive line over the plurality of resistors.

15. The method of claim 14, wherein chemisorbing at least a portion of a graphite material to a conductive material to form at least one first electrode comprises introducing a carbon-containing precursor to the conductive material to chemisorb graphene thereon.

16. The method of claim 15, wherein introducing a carbon-containing precursor to the conductive material comprises introducing at least one of acetylene, ethylene, and methane to the conductive material at a temperature of less than about 700° C.

17. The method of claim 14, wherein chemisorbing at least a portion of a graphite material to a conductive material to form at least one first electrode comprises:

depositing the at least a portion of the graphite material over an underlying conductive material; and
annealing the at least a portion of the graphite material and the conductive material.

18. The method of claim 14, wherein forming at least one conductive line over the plurality of resistors comprises forming a plurality of conductive lines in a direction perpendicular to a plurality of the first electrodes.

19. A semiconductor structure, comprising:
    a first electrode comprising a graphite material chemisorbed on a conductive material;
    a low-k dielectric material overlying the first electrode; and
    a high-k dielectric material disposed between the low-k dielectric material and a second electrode.

20. The semiconductor structure of claim 19, wherein the conductive material of the first electrode comprises at least one of nickel, cobalt, palladium, tungsten, platinum, and titanium nitride.

21. The semiconductor structure of claim 19, wherein the graphite material comprises graphene.

22. The semiconductor structure of claim 21, wherein the graphene chemisorbed on the conductive material comprises a complex of the graphene and nickel chemisorbed on a nickel material.

23. The semiconductor structure of claim 19, wherein a work function of the first electrode is lower than a work function of the second electrode.

24. The semiconductor structure of claim 19, wherein the first electrode has a work function of less than about 5 eV.

25. The semiconductor structure of claim 19, wherein the second electrode comprises nickel.

26. The semiconductor structure of claim 19, further comprising a resistor disposed adjacent the second electrode.

27. A semiconductor device, comprising:
    a plurality of memory cells disposed between a plurality of first conductive lines and second conductive lines, each of the memory cells of the plurality comprising a resistor disposed adjacent a diode structure, the diode structure comprising:
        a first electrode comprising a graphite material chemisorbed onto a conductive material;
        a low-k dielectric material and a high-k dielectric material overlying the first electrode; and
        a second electrode overlying the high-k dielectric material;
        the graphite material located at an interface between the conductive material and the low-k dielectric material.

28. The semiconductor device of claim 27, wherein the first electrode comprises a portion of one of the first conductive lines of the plurality of first and second conductive lines.

29. The semiconductor device of claim 27, wherein each of the first conductive lines of the plurality of first and second conductive lines is disposed substantially perpendicular the second conductive lines of the plurality of first and second conductive lines.

30. The semiconductor device of claim 27, wherein the conductive material consists of nickel.

31. The semiconductor device of claim 27, wherein the graphite material comprises graphene chemisorbed to the conductive material of the first electrode.

32. The semiconductor device of claim 27, wherein a difference between a work function of the first electrode and a work function of the second electrode is greater than or equal to about 1 eV.

* * * * *